US006493411B1

(12) United States Patent
Chu et al.

(10) Patent No.: US 6,493,411 B1
(45) Date of Patent: Dec. 10, 2002

(54) METHOD FOR PRODUCING FORMED BODIES OF HIGH TEMPERATURE SUPERCONDUCTORS HAVING HIGH CRITICAL CURRENTS

(75) Inventors: Wei-Kan Chu, Pearland, TX (US); Jiarui Liu, Pearland, TX (US)

(73) Assignee: University of Houston-University Park, Houston, TX (US)

( * ) Notice: Subject to any disclaimer, the term of this patent is extended or adjusted under 35 U.S.C. 154(b) by 1438 days.

(21) Appl. No.: 08/724,431

(22) Filed: Oct. 1, 1996

Related U.S. Application Data (62) Division of application No. 08/383,664, filed on Feb. 2, 1995, now abandoned, which is a continuation of application No. 08/141,899, filed on Oct. 22, 1993, now abandoned, which is a continuation of application No. 07/723,405, filed on Jul. 1, 1991, now abandoned.

(51) Int. Cl.[7] ............................. G21G 1/02; C22F 3/00
(52) U.S. Cl. ..................... 376/158; 376/183; 376/185; 148/97; 505/320
(58) Field of Search ................. 376/158, 183, 376/185; 505/320, 725; 148/97

(56) References Cited

U.S. PATENT DOCUMENTS

| | | | | |
|---|---|---|---|---|
| 3,258,351 A | * | 6/1966 | Paymel ..................... 376/158 |
| 3,258,352 A | * | 6/1966 | Paymel ..................... 376/158 |
| 3,310,395 A | * | 3/1967 | Swartz et al. .................. 505/1 |
| 4,842,366 A | * | 6/1989 | Sawada et al. ................ 505/1 |
| 4,883,922 A | * | 11/1989 | Yokota et al. ........... 174/125.1 |
| 4,959,348 A | * | 9/1990 | Higashibata et al. ........... 505/1 |
| 4,968,662 A | * | 11/1990 | Urano et al. .................... 505/1 |
| 4,988,674 A | * | 1/1991 | Mir et al. ....................... 505/1 |
| 4,996,192 A | * | 2/1991 | Fleischer ........................ 505/1 |
| 4,999,338 A | * | 3/1991 | Wijeyesekera et al. ........ 505/1 |
| 5,021,398 A | * | 6/1991 | Sharma et al. ................. 505/1 |
| 5,034,373 A | * | 7/1991 | Smith et al. .................... 505/1 |
| 5,051,397 A | * | 9/1991 | Sato et al. ...................... 505/1 |
| 5,087,606 A | * | 2/1992 | Fleischer et al. .............. 505/1 |
| 5,108,985 A | * | 4/1992 | Iino et al. ....................... 505/1 |
| 5,114,702 A | * | 5/1992 | Pederson et al. ........... 423/639 |
| 5,137,866 A | * | 8/1992 | Matsumoto et al. ........... 505/1 |

OTHER PUBLICATIONS

Physica C, vol. 172, (1990), pp 193–198, Strobel et al.*
Report No. 89CRD047, Apr. 1989, pp 1–17, Fleischer et al (III), Alloy Properties Laboratory.*
Physical Review B, vol. 40, No. 4, (8/89), Fleischer et al (II), pp 2163–2167.*

* cited by examiner

*Primary Examiner*—Harvey E. Behrend
(74) *Attorney, Agent, or Firm*—Akin, Gump, Strauss, Hauer & Feld, LLP (57) ABSTRACT

Thermal neutron irradiation of superconducting body compositions into which Li or B has been incorporated as a unit cell external or internal dopant introduces by the nuclear reaction of the dopant pinning centers which substantially improve the critical current density of the body.

23 Claims, 4 Drawing Sheets

METHOD FOR PRODUCING FORMED BODIES OF HIGH TEMPERATURE SUPERCONDUCTORS HAVING HIGH CRITICAL CURRENTS

This application is a divisional application of U.S. patent application Ser. No. 08/383,664 filed Feb. 2, 1995 which in turn is a continuation application of U.S. patent application Ser. No. 08/141,899 filed Oct. 22, 1993 which in turn is a continuation application of U.S. patent application Ser. No.07/723,405 filed Jul. 1, 1991, all of which are now abandoned.

BACKGROUND OF THE INVENTION

The most distinctive property of a superconductive material is its absence of electrical resistance when it is at or below a critical temperature. This critical temperature (Tc) is an intrinsic property of the material.

Research into the ability of specific materials to superconduct began in 1911 with the discovery that mercury superconducts at a Tc of about 40° K. Since then, many applications for superconducting materials have been conceived, but such applications could not be commercialized because of the extreme low Tc of the superconducting materials then available.

Although many materials have since been examined in an effort to find compositions which superconduct at higher temperatures—temperatures at which the more economical and practical coolant of liquid nitrogen could be used—until about 1986 the highest temperature superconductor known was $Nb_3Ge$ having a critical temperature, Tc, of approximately 23.2K. Before 1987, superconducting devices, even those which employed the $Nb_3Ge$ superconductor, required the use of liquid helium as the refrigerant-coolant.

In late 1986 Bednorz and Muller disclosed that certain mixed phase compositions of La—Ba—Cu—O appeared to exhibit superconductivity being at an onset temperature, $T_{co}$, of about 30K. Bednorz et al., *Z. Phys. B., Condensed Matter*, Vol. 64, pp. 189–198 (1986). Investigation of that La—Ba—Cu—O mixed phase system established that the crystalline phase therein responsible for superconductivity had a crystal structure like that of $K_2NiF_4$ (214). Since then it has been determined that whatever might be the rare earth metal or the alkaline earth metal constituent of a 214 system, the upper temperature limit of superconducting onset, $T_{co}$, of superconductors of a 214 type crystalline structure is no greater than about 38K. Liquid helium was still required as the coolant for such a 214 type of material.

Following the discovery of superconductivity in a rare earth-alkaline earth-Cu oxide system of a 214 crystalline structure, a new class of rare earth-alkaline earth-copper oxides was discovered which are superconductive at temperatures above the boiling point of liquid nitrogen, 77K. These new rare earth-alkaline earth-copper oxides are of the formula $L_1M_2Cu_3O_7$ wherein L is a rare earth metal and M is an alkaline earth metal. The $L_1M_2Cu_3O_7$ compositions are commonly referred to as "123" high-temperature superconductors in reference to the stoichiometry in which the rare earth, alkaline earth, and copper metal atoms are present, namely a ratio of 1:2:3. Subsequent to the discovery of the 123 high temperature superconductors, another form of high temperature superconductor was discovered having the formula $T_2M'_2Ca_nCu_{n+1}O_{6+2n}$ wherein T is bismuth and M' is strontium or T is thallium and M' is barium, and "n" is 1, 2, or 3. Both types of "high temperature superconducting" (HTS) compositions are ceramics materials.

The 123 high temperature superconducting compounds have a perovskite related crystalline structure. The unit cell of such 123 compounds consists of three sub-cells in alignment along the crystallographic C-axis wherein the center of the middle subcell is occupied by a rare earth metal atom, the center of each end subcell is occupied by an alkaline earth metal atom, and copper atoms occupy the corner positions in each subcell. X-ray and neutron powder diffraction studies indicate the structure of superconductive 123 compounds to be oxygen deficient and that the ordering of oxygen in the basal planes is critical to the existence of superconducting properties in such compounds. See C. Poole et al, *Copper Oxide Superconductors* (John Wiley & Sons 1988). The unit cell formula of a 123 compound is $L_1M_2Cu_3O_{6+\delta}$ ($\delta$=0.1 to 1.0, preferably about 1.0) wherein the rare earth metal constituent, L, is yttrium, lanthanum, neodymium, samarium, europium, gadolinium, dysprosium, holmium, erbium, thulium, ytterbium, or lutetium, or mixtures thereof including mixtures with scandium, cerium, praseodymium, terbium and the alkaline earth constituent, M, is barium, strontium or mixtures thereof. Studies indicate that when $\delta$ is between about 0.1 to about 0.6, the resulting 123 compound assumes a tetragonal unit cell crystallographic symmetry and is non-superconductive. In the tetragonal unit cell symmetry, the lattice dimension of the C-axis is approximately 11.94 angstroms and that of the A and B axis is approximately 3.9 angstroms. When $\delta$ is between about 0.7 and 1.0, the resulting 123 compound has an orthorhombic unit cell crystallographic symmetry and is superconductive. The orientation of the oxygen atoms in the unit cell causes, the unit cell to compress slightly along the A crystallographic axis and thus the lattice dimension of the A axis is less than that of the B axis. Lattice constants in the orthorhombic symmetry are about A=3.82, B=3.89 and C=11.55 angstroms.

With the discovery of the new "high temperature superconducting" (HTS) compounds—HTS compounds are those which superconduct at a Tc above the temperature at which liquid $N_2$ can be used as a refrigerant—it has become economically possible to pursue many previously conceived applications of the superconductivity phenomena which before were commercially difficult wherein cooling by liquid helium was required. Since they superconduct at temperatures greater than 77K, the new high temperature superconductors may in practical applications be cooled with liquid nitrogen—a more economically feasible refrigerant. The HTS compounds, both the 123 compositions and those containing bismuth or thallium, simplify and enhance the reliability of commercial applications of superconductors. Recent studies also show that the HTS compounds have better performance at 4K than the prior materials.

Nevertheless, the ceramic HTS compounds have been economically and technologically impractical for use in some applications due to the inability of bodies thereof (1) to carry high current loads ($J_c(0)$) (2) to carry high current loads in intense magnetic fields ($J_c(H)$) (3) and to entrap strong magnetic fields ($B_t$). As a result, significant commercial and technological barriers against use of the ceramic HTS compounds as a superconductor body in a variety of practical applications, such as in magnets, magnetic separators, transmission lines, trapped field magnets, levitation bearing and magnetically levitating trains (meglav), still exist.

In magnetic separators, for example, the body of a superconducting material is required, as a practical constraint, to have a critical current density ($J_c$) between about $10^3$ to $10^5$ amps/cm$^2$ in a magnetic field between 0 to 10 T. To be practical for some magnet applications, bodies of a ceramic HTS compound must be capable of entrapping within its crystalline structure a high magnetic field. The critical current ($J_c$) which a body of a HTS compound is capable of carrying is strongly affected by the granular alignment and homogeneity of the polycrystals HTS compound comprising the body and by the distribution and force with which lattice defects within the HTS material can pin magnetic flux lines. Accordingly, one approach to improve the $J_c$ of a ceramic HTS body has been directed to methods of processing the HTS composition into shaped bodies wherein the number and content of "weak links" due to its granular ceramic nature is reduced. Another approach has examined techniques whereby strong flux pinning centers may be homogeneously introduced into the HTS composition of which a body article is composed.

The Jc and ability to entrap a magnetic field of a HTS compound body, particularly a 123 HTS compound, is dramatically influenced by several factors which introduces "weak links" into the HTS material of the body. "Weak links" exist in the forms of (1) grain boundaries; (2) micro-cracks; (3) impurity content—i.e., the wt. % content of the body of nonsuperconducting phases (i.e., $L_2BaCuO_5$, $BaCuO_2$, $CuO$, etc.); (4) the porosity of the body (i.e. body density); (5) chemical inhomogeneity; and (6) electrical anisotropy.

A "weak link" is any non-superconducting defect which intervenes between the electrical communication from one part of an HTS body to an adjacent part of an HTS body. A 123 HTS compound crystallizes into "grains" which are comprised of individual unit cells of 123 compound which, with reference to each other unit cell of 123 compound in the grain, are in perfect alignment—i.e., all "AB" planes of each 123 unit cell are in perfect parallel alignment with each other 123 unit cell comprising that grain. Different "grains" of 123 may have their "AB" plane out of perfect parallel alignment therebetween. The degree of such misalignment between the AB planes of adjacent grains of 123 may be very slight or very great. High angle grain boundaries—i.e., those wherein there is a high degree of misalignment of the intergranular "AB" planes between adjacent grains is a "weak link" (1).

The intervention of a non-superconducting composition between "AB" planes of one grain of 123 to that of another grain is yet another form of "weak link." Superconduction across the non-superconducting composition between the adjacent 123 grains can still occur, by the "Josephson (or tunnelling) effect," in the absence of an externally applied magnetic field. However, such intervening insulator "impurity weak link"—depending upon its dimensions—quickly become electrically resistive in the presence and in proportion to the extent of an externally applied magnetic field.

Such "insulating" weak links may be comprised of an "insulator impurity composition" which occupies the physical space between adjacent grains of 123 HTS or may be physical voids between such grains. When an insulator composition occupies such space, the "weak link" is referred to as a "secondary" or "impurity" phase (3). When such weak link is a void of any material, it is referred to either as "porosity" (4) or as a "microcrack" (2), depending upon the nature of the processing circumstances by which such void in a body of the 123 HTS compound came into being.

Another form of "weak link" may occur intragranularly wherein, although the AB planes of the 123 compound comprising such grain are perfectly parallel aligned, some portions of such AB planes are imperfectly oxygenated. That is, within a parallel alignment series of AB planes of individual unit cells comprising a 123 grain, some or a series of such aligned unit cells are comprised of a cell formula wherein the oxygen content is less than about 6.7 and hence such unit cells are of a nonsuperconducting tetragonal crystalline symmetry. Such "weak links" are referred to as of the "local or global deficiency of oxygen" kind (5).

The last form of weak link is associated with the different degrees of capability of a 123 grain to carry current in differt directions, e.g., easier along the AB-plane than perpendicular to the AB-plane. The misalignment of the AB-plane will force current to flow in part, no matter how small, within the 123 HTS body along the C-axis which will act as a weak-link to limit $J_c$. Each of the above weak link factors reduces the amount of current (I) which is able to flow from one end of a 123 HTS body to another end of the 123 HTS body before the body begins to exhibit an electrical resistance. One of the most significant weak link sources is high angle misaligned grain boundaries.

Weak links in the form of lack of density—i.e., existence of porosity and/or the existence of micro-cracks—, impurities, or high angle misaligned grain boundaries in a body composed of 123 HTS compound, and the presence of oxygen deficiencies in the grain boundaries, each detract from the amount of current which that body of a 123 HTS compound is capable of carrying before it will exhibit electrical resistance to flow of that "critical" amount of current—i.e., the critical current density, ($J_c$), of that body. A 123 HTS compound, whether produced by solid state reaction, coprecipitation or by a sol-gel technique has, as an intrinsic property, a $T_c$ of $\geq 77K$. However, the $J_c$ of a body of a 123 HTS compound is highly dependent on the methodology used to produce the 123 HTS compound body. Accordingly, the process by which a body article of 123 HTS is formed—whether that body is in wire, ribbon, film, rod or plate form—dictates many of the practical uses to which that 123 HTS body form may be put, dependent upon the $J_c$ of the body article.

Before the discovery of the 123 HTS compounds allowed use of liquid $N_2$ as a more economical coolant, many possibilities of practical application of superconductivity were unattainable because of the high cost associated with; the use of liquid helium as the coolant required for superconducting materials previously known. Even though HTS compounds have overcome the refrigerant cost barrier which existed against various practical applications of superconductivity, various other practical applications to which a body of HTS compound may be put are, at this time, still limited by the difficulties associated with production of a HTS compound in a body form having a $J_c$ or an ability to carry a large total amount of current (I) required for the practical practice for that particular application. For many applications, the body article must carry a large amount of total current (I). Total current carrying capacity of a body is governed by its cross-sectional dimension and the $J_c$ of the HTS of which that body is composed—i.e., $I=J_c$ ($A/cm^2$)·cross-sectional dimensions ($cm^2$).

A most serious obstacle to the use of high temperature superconductors (HTS's) for large current applications is the limited total current carrying capacity of these HTS's in bulk body forms. The limited $J_c$ of the HTS compounds of which a body is composed seems to be consistent with the small pinning potential associated with the small coherent length of HTS materials. See, Y. Yeshurun et al., *Phys. Rev. Lett.* 60 2202–2205 (1988). However, experiments have shown that a $J_c$ of up to $5 \times 10^6$ at $A/cm^2$ exists in 123 HTS films at O T and 77K and $5 \times 10^5$ $A/cm^2$ in intragrains at 0.9 T and 77 K when 123 HTS compounds are properly processed. See R.

K. Singh, et al., *Appl. Phys. Lett.*, 54 2271–2273 (1989) and R. B. van Dover, et al., *Nature*, 342 55–57 (1989).

To overcome some of the weak link problems in order to enhance $J_c$, one approach has been to use a melt-texturing technique to form bodies of a 123 HTS compound. See T. Aselage, et al., *J. Mat. Res.*, Vol. 3, pp. 279–291 (1988) and, M. Murakami, et al., *Jap. J. Appl. Phys.*, Vol. 28, pp. L399–L401 (1989). It is known that $Y_1Ba_2Cu_3O_{6+\delta}$ undergoes the transition of $(Y_2O_3+\text{liquid}) \rightarrow (Y_2BaCuO_5+\text{liquid}) \rightarrow (Y_1Ba_2Cu_3O_{6+\delta}+\text{liquid}$ of $BaCuO_2$ and $CuO$) as it cools from a single-phase liquid region to ~900° C. Near ~1050° C., $Y_1Ba_2Cu_3O_{6+\delta}$ forms through a peritectic solidification according to $Y_2BaCuO_5+\text{liquid}$ $(3BaCuO_2+2CuO) \rightarrow 2Y_1Ba_2Cu_3O_{6.5}$. The peritectic temperature for a $L_1Ba_2Cu_3O_{6+\delta}$ compound is that temperature at which its constituents; namely, $L_2Ba_1Cu_1O_5$ (solid phase)+a liquid phase comprising $3BaCuO_2$ and $2CuO$, react to form $L_1Ba_2Cu_3O_{6+\delta}$. For a $LiBa_2CU_3O_{6+\delta}$ compound wherein L is Y, the peritectic temperature range has been reported to be about 1020–1050° C, with peritectic solidification to produce $Y_1Ba_2Cu_3O_{6+\delta}$ beginning at 1020±20° C. and continuing as the composition is cooled to about 950±30° C. See, for example, Terry Aselage and Keith Keefer *J. Mater. Res.*, 3(16) November/December 1988, pp. 1279–1291.

It is also known that heating above the solidus temperature helps dissolve the impurity phases which are precipitated in the grain boundaries, and that crystal grains of 123 compound grow more easily in a liquid solution. Heretofore, all reported melt-textured methods to generate 123 HTS compound bodies of large $J_c$ consist of rapid heating a body composed of a $Y_1Ba_2Cu_3O_{6+\delta}$ compound above the solidus temperature (or even above the melting point) of the compound followed by slow cooling of the body through the "peritectic temperature" of the compound. This has been achieved by a prescribed temperature schedule i.e., certain time (t) rates of temperature (T) variation (dT/dt). The temperature schedule has been shown to be critical to the morphology grains of the 123 compound obtained in the body article. For instance, both needle-like and platelet grain formations have been obtained in bodies composed of $Y_1Ba_2Cu_3O_{6+\delta}$. See S. Jin, et al., *Phys. Rev. B.*, 37, 7850–7853 (1988) and P. J. McGinn et al., *Physica C*, 156, 57–61 (1988).

In a melt-textured growth process for preparing bodies of $Y_1Ba_2Cu_3O_{6+\delta}$ all portions of the entire body are simultaneously first elevated in temperature beyond the peritectic temperature of the compound to incongruently melt the 123 compound into $Y_2BaCuO_5$ and a liquid phase. Thereafter the body is allowed to cool, at a controlled rate (dT/dt), to a temperature below the solidus temperature wherein the $Y_2BaCuO_5$ and liquid phase react to reform the 123 compound which crystallizes. In the melt-textured growth process reported by Jin et al. in *Appl. Phys. Lett.*, Vol. 52, pp. 2074–2076(1988) and Vol. 54, pp. 584–586 (1989) and Murakami et al. in *Jpn. J. Appl. Phys.*, Vol. 28, pp. L1125–1127 (1989) the entire body of 123 compound is first heated above the solidus or peritectic temperature and thereafter the entire body is subjected to a thermal gradient to promote directional solidification of the 123 grains as the body is permitted to cool at a controlled rate to a temperature below the solidus temperature.

By use of a "melt textured growth" process, a number of groups have reported making 123 compound bodies of enhanced $J_c$ To date the highest reported $J_c$ of a 123 body prepared by a melt textured growth technique is $1.7 \times 10^4$ A/cm$^2$ by Jin et al., *Phys. Rev. B. Vol.* 37, pp. 7850–7853 (1988) and *Appl. Phys. Lett.*, Vol. 42, pp. 2074–2076 (1988); later Salama et al. employed a liquid-phase processing method to obtain a $J_c \sim 7.5 \times 10^4$ A/cm$^2$; both in bulk bodies of $YBa_2Cu_3O_{7-\delta}$ (Y123) at 0 T and 77 K after prolonged oxygen annealing. In each method of body treatment the enhanced $J_c$ has been ascribed to the drastically improved grain alignment, phase purity, and densification in $Y_1Ba_2Cu_3O_{6+\delta}$ compound of which the body is composed.

In a second approach for enhancing the $J_c$ of a HTS compound body fast neutron irradiation of a body composed of sintered polycrystalline HTS and of single crystals of HTS has been examined for its effects upon the superconducting properties of such materials. A. Wisniewski, et al., *Solid State Communications*, Vol. 65 (1988) 577–580; H. Füpfer et al., *Z. Phys. B.* 69 (1987) 167–171; Cost et al., *Phys. Rev. B.* 37 (1988) 1563–1568, report that fast neutron irridation of sintered polycrystalline bodies of $Y_1Ba_2cu_3O_7$ decreases the onset transition temperature of such bodies while increasing the $J_c$.

Fast neutron irradiation of single crystals of $Y_1Ba_2Cu_3O_7$ has been reported to increase $J_c$ without significant adverse affect on $T_c$. See Umeqawa et al., *Phys. Rev. B.* 36 (1987) 7151–7154. Although it has been reported that nominally identical fast neutron irradiations have resulted in effects on critical current ranging from moderate enhancement to degradation, the suggestion has been made that fast neutron irradiation may enhance the $J_c$ at 77K of a body article formed by the melt-textured growth of a HTS such as $Y_1Ba_2Cu_3O_7$. See Van Dover et al., *Nature*, Vol. 342 (1989) 55–57.

Other forms of neutron radiation of HTS bodies have also been studied. Hence, Hastings et al., *J. Am. Ceram. Soc.* 71 (1988) C505–506, reports that thermal neutron radiation of a sintered polycrystalline body of $Y_1Ba_2Cu_3O_7$ produced a loss of its 90K superconductive properties, although such 90K super-conducting properties could later be recovered by a post irradiation anneal of such body in flowing $O_2$ at 760K. Fleicher et al., *Phys. Rev. B*, 40 (1989) 2163–2169, reports that thermal-neutron irradiation of a sintered polycrystalline body of $Y_1Ba_2Cu_3O_7$ doped with uranium enhanced the $J_c$ of the body.

Further efforts to enhance the $J_c$ of a HTS body have been reported by irradiation of such body with high energy protons, Van Dover et al., *Information from High $T_c$ Update*. Vol. 4, No. 4, p.2, Feb. 15, 1990. But such technique is applicable only to thin films due to the small penetration depth of protons.

In many respects, the enhancement of the $J_c$ of a body comprised of a HTS composition by irradiation with fast neutrons is undesirable since the source for fast neutrons is expensive and can impart to the body a higher than desirable degree of radioactivity. Likewise the use of uranium doped bodies of HTS composition which are irradiated with thermal neutrons to enhance $J_c$ is undesirable because of the long-life radioactivity which would be imparted to such body by such technique.

It is desirable to develop a method by which the $J_c$ of a bulk body composed of a HTS composition, particularly a body produced by melt texturizing, may be enhanced by creating a homogeneous distribution of strong flux pinning centers within such body without imparting thereto an undesirable level of radioactivity.

SUMMARY OF THE INVENTION

Enhancement of the $J_c$ of bulk superconductors is a crucial and critical problem for high $T_c$ superconductor applications. This invention comprises a new process to improve the $J_c$ of bulk body articles composed of HTS compositions, particularly bodies composed of the $L_1M_2Cu_3O_7$ HTS compositions and the bismuth and thallium HTS compositions, by thermal neutron induced nuclear reaction in the superconductors doped by $^6$Li or $^{10}$B. The advantages of the process of this invention are simplicity, uniformity for bulk material processing, no long life-time radioactivity to be imparted to the superconductor body, and economy of the process.

A thermal neutron flux is a simple and relatively inexpensive particle source. Thermal neutron irradiation is a very uniform process in the bulk volume of a body composed of a HTS composition due to the very long penetration depth of thermal neutrons. The uniform irradiation of bodies composed of $^6$Li or $^{10}$B doped HTS compositions is an effective technique for modification of body articles thereof because of the large thermal neutron cross-section for $^6$Li (945 barns) and $^{10}$B (4010 barns). The thermal neutron induced reactions which the $^6$Li and $^{10}$B dopants within the body undergo are:

$^6$Li + n ⟶ $^3$H (2.73MeV) + $^4$He (2.05MeV)

$^{10}$B + n ⟶ $^7$Li∗ (0.84MeV) + $^4$He (1.47MeV)

⟶ $^7$Li(1.01MeV) + $^4$He (1.78MeV)

As a result of the long penetration depth of thermal neutrons into body articles composited of such superconductor compositions and the uniform doping of $^6$Li and $^{10}$B into these materials the distribution of the nuclear reaction and the flux pinning defects induced by the reaction products are very evenly distributed in the bulk materials of the HTS composition which comprise the body articles which are so treated.

The body article of HTS composition to which this process applies is one which contains $^6$Li or $^{10}$B in intimate and homogeneous admixture with the HTS composition. The dopant D, which is Li or B, may be incorporated into the HTS composition in either of two ways, as a unit cell external or as a unit cell internal dopant. In the former case the precursor composition comprises an intimate mixture of the L, M and Cu reagents in proportions which provide a ratio of L:N:Cu of 1:2:3 and this mixture further comprises a quantity of the Li or B reagent such that upon sintering an HTS composition of a $L_1M_2Cu_3O_7$ unit cell formula results. In this case, the Li or B content of the composition is dispersed at positions external to the $L_1M_2Cu_3O_7$ unit cells, such as at the grain boundaries between different grains of the 123 HTS composition which comprises the body article. In the unit cell internal method for incorporation of the dopant D, which is either Li or B, the L, M, Cu and D reagents are intimately mixed in proportions which provide for a ratio of metal atoms of the formula $(L+M)_{3-z}D_zCu_3$ wherein z is greater than zero and equal to or less than 0.3 and the atomic ratio of L:M is from about 0.35 to about 0.6. When the precursor mixture is sintered or melt texturized to convert it into a HTS composition the product composition which results is of the formula $(L+M)_{3-z}D_zCu_3O_{6+d}$ where d is 0.1 to 1.0, and the dopant atom D is incorporated into the 123 unit cell structure wherein it occupies either a L or a M atomic site. In the case of a Bi or Tl HTS composition, i.e., those of the formula $T_2M'_2Ca_nCu_{n+1}O_{6+2n}$, the dopant D may also be externally or internally incorporated. When internally incorporated the precursor reagents are mixed in proportions to provide a product composition, after sintering or melt texturizing, of the formula $T_2M'_2Ca_n(Cu_{1-z'}D_{z'})_{n+1}O_{6+2n}$ wherein z' is greater than zero and equal to or less than 0.5.

The method of internal incorporation of the dopant D is preferred since this method is more adapted to the preparation of high quality HTS body articles by melt texturizing, i.e. greater grain alignment with less intergranular impurity weak link content. A dopant most preferred is Li, particularly preferred is a lithium which is enriched in $^6$Li. The $^6$Li or $^{10}$B containing HTS 123 composition may be prepared in a body article form by sintering or melt texturizing of preshaped bodies of intimately mixed $L_2O_3$, $MCO_3$ and CuO powders to which has been added and mixed $Li_2Co_3$ or $B_2O_3$ to the level of $^6$Li or $^{10}$B desired. As a preferred alternative to simple sintering, the body article is treated by a melt texturizing process to produce a high degree of grain alignment in the body. Bismuth and thallium HTS bodies are prepared in like manner.

The irradiation of such $^6$Li or $^{10}$B doped bodies of HTS composition by thermal neutrons causes the $^6$Li or $^{10}$B content thereof to undergo an induced nuclear reaction. The energetic light particles from the nuclear reaction produce radiation damage and defects with the HTS composition of the body which uniformly introduces strong flux pinning centers within the bulk volume of the body, thereby substantially enhancing the $J_c$ of the body compared to its unirradiated state. For highest attainable $J_c$ it is preferred to practice this invention with $^6$Li or $^{10}$B internally doped articles that are prepared by a melt texturizing technique.

The invention comprises $^6$Li or $^{10}$B doped HTS compound, preferably a 123 HTS compound, having a predetermined body shape which, after irradiation with thermal neutrons, has a current density, $J_c$, of from about $10^3$ to about $10^5$ amps/cm$^2$ or greater at zero magnetic field and a temperature of at least 77K.

The preferred 123 HTS composition to which the process of this invention is applicable is internally doped with Li to prepare preshaped 123 HTS compound body articles is $(L+Ba)_{3-z}Li_zCu_3O_7$, most preferably wherein L is yttrium. The preferred $T_2M'_2Ca_nCu_{n+1}O_{6+2n}$ HTS composition is one wherein T is bismuth and M' is strontium and the HTS body is internally doped with Li to provide a formula of $Bi2Sr_2Ca_n(Cu_{1-z'}Li_{z'})_{n+1}O_{6+2n}$. The preferred dopant is one of lithium, most preferred is a lithium which is enriched in the $^6$Li isotope.

DETAILED DESCRIPTION OF THE PREFERRED EMBODIMENTS

To prepare the precursor composition from which the HTS compound for the body article will be prepared, any of the three commonly employed techniques may be used, namely the solid state, the coprecipitation, and the sol-gel techniques. A description of these techniques may be found in *Proceeding on the Symposium on High Temperature Superconducting Materials. University of North Carolina. Chapel Hill. N.C.*, W. E. Hatfield and J. H. Miller, Jr. (Eds.), M. Dekker, New York (1988).

The solid-state technique is preferred for purposes of its simplicity. To prepare the HTS presursor composition, oxygen-rich compounds of the desired metal components, such as oxides, nitrates, or carbonates, are intimately mixed in the amounts appropriate to supply the metal atoms in the ratios desired for an HTS compound.

The formula to which the HTS compound is to be prepared will depend upon whether the dopant is to be externally or internally incorporated. Wherein the Li or B dopant is to be externally incorporated, for a 123 HTS compound, oxygen rich compounds of the desired metal components are used in amounts appropriate to supply the metal atoms in the ratio of L:M:Cu of 1:2:3; for a bismuth or thallium HTS compound the ratio of T:M':Ca:Cu is 2:2:n:n+1. A dopant compound containing Li or B is added in the amount desired and the compounds are intimately mixed, formed into a body of the desired shape and then sintered or melt texturized to convert the mixture into a HTS compound of the formula $L_1M_2Cu_3O_7$ or $T_2M'_2Ca_nCu_{n+1}O_{6+2n}$, as the case may be. The Li or B dopant is intimately distributed throughout the body externally of the unit cell of the HTS compound with the dopant being primarily located at grain boundary locations. In the case of external doping it is preferred to employ an amount of the dopant (D) which provides for an atomic ratio of D:Cu which is equal to or less than 0.5, more preferably less than 0.4, and most preferably less than 0.3. It is most preferred to utilize a dopant that is isotopically enriched in $^6Li$ or $^{10}B$ isotopes. Wherein the Li or B dopant ("ID") is to be internally incorporated within the HTS compound oxygen-rich compounds of the desired HTS metals and the dopant compound are intimately mixed in the amounts appropriate to supply atoms to provide a final HTS compound of the formula:

$$(L+M)_{3-z}D_zCu_3O_{6+d}$$

wherein:

L is yttrium, lanthanum, neodymium, samarium, europium, gadolinium, dysprosium, holmium, erbium, thulium, ytterbium, or lutetium, or mixtures thereof including mixtures with scandium, cerium, praseodymium, terbium;

M is barium, strontium or mixtures thereof;

D is lithium or boron;

"z" is greater than zero and less than or equal to 0.3; "d" is from about 0.7 to about 1.0; and the ratio of L::M is from about 0.35 to about 0.6 provided that L does not exceed one in number and M does not exceed two in number;

or $$T_2M'_2Ca_n(Cu_{1-z'}D_{z'})_{n+1}O_{6+2n}$$

wherein

T is bismuth and M' is strontium or

T is thallium and M' is barium;

"n" is 1 to 3;

D is lithium or boron; and

"z" is greater than zero and less than or equal to 0.5.

The intimately mixed compounds are formed into a body of the desired shape and then sintered or melt texturized to convert the mixture into the internally doped HTS compound. The Li or B dopant atoms are incorporated within the unit cells of the HTS compound. In the case of a 123 HTS compound the dopant atom is located at a L and/or the M atomic occupation sites within the unit cell of a 123 HTS compound. In the case of a bismuth or thallium HTS compound the dopant atom is located at a Cu atom occupation site within the unit cell of the HTS composition.

The preferred method for incorporation of the dopant is that of internal incorporation. In this regard, with respect to a 123 HTS compound, it is preferred to incorporate the dopant in an atomic amount relative to copper to provide for a ratio of $^6Li:Cu$ of from about $1\times10^{-7}$ to about $2\times10^{-1}$, more preferably from about $1\times10^{-6}$ to about $1\times10^{-1}$, and most preferably from about $1\times10^{-5}$ to about $5\times10^{-2}$. With regard to the above amounts of dopant it is preferred that the L:M ratio be from about 0.35 to about 0.6, more preferably from about 0.45 to about 0.55 provided that L does not exceed 1 and M does not exceed 2. Most preferably, the L:M ratio is 0.5. Preferably the total amount of lithium should not exceed a quantity which provides for a ratio of Li:Cu of about $1\times10^{-1}$ (i.e. $Z \leq 0.3$). The desired loading of $^6Li:Cu$ can be achieved at lower total loading of lithium by use of a lithium reagent which is enriched in the $^6Li$ isotope. Likewise, with respect to boron, its total quantity should not exceed that which provides a ratio of B:Cu of $7\times10^{-1}$. Use of a boron reagent which is enriched in the $^{10}B$ isotope allows a lower total loading of boron into the HTS compound.

With respect to the internal incorporation of a dopant within a bismuth or a thallium HTS composition it is preferred to incorporate the dopant in an atomic amount relative to copper to provide for a ratio of $^{10}B:Cu$ or $^6Li:Cu$ of from about $2.5\times10^{-8}$ to about $6\times10^{-1}$; more preferably from about $1\times10^{-6}$ to about $1\times10^{-1}$; and most preferably from about $1\times10^{-4}$ to about $1\times10^{-3}$. Preferably the total loading of dopant relative to copper should not exceed about 1.0.

The starting precursor 123 composition may be prepared by a solid state reaction procedure wherein $L_2O_3$, $M(NO_3)_2$, $MCO_3$ or $M(OH)_2$ and CuO powders of reagent grade are intimately ground and mixed in a weight percent proportion to provide a mixed powder wherein the appropriate ratio of the rare earth (L) to alkaline earth (M) to copper metal atoms. The Li or B dopants may be added to and intimately mixed with the powder reagents before sintering. The precursor composition may also be prepared by the coprecipitation of (nitrate) salts of L, M and Cu in the appropriate metal constituent ratios. If desired, the precursor composition may be prepared by a sol-gel technique. When prepared by a coprecipitation or sol-gen technique it is preferred to add and intimately admix the Li or B dopant subsequently.

The precursor composition is preferably prepared as a powdered product—i.e, one the powder constituents of which are not yet formed into a particular coherent shape. In this event, it is necessary to add and intimately admix the Li or B dopant with such powder prior to forming such Li or B doped powdered precursor composition into the body form desired before subjecting such shaped body to sintering or melt texturizing.

However, the precursor composition is prepared, the method of this invention is operative on a preformed body comprised of an oxide composition wherein the L:M:Cu:D metals are intimately admixed. The precursor composition is reacted, i.e., sintered or melt texturized, to convert its constituent components into a 123 HTS compound.

Those Li compounds which are powders and are suitable for incorporation into the precursor composition include LiOH, $LiO_2$, LiH, $Li_2CO_3$ and $Li_2C_2$ with $Li_2CO_3$ being preferred. Those B compounds which are suitable include $B_2O_3$.

A compound of lithium can be employed wherein the isotopes of lithium are present in their natural abundance, namely $^6Li$ comprises about 7.5 weight % and $^7Li$ comprises about 92.5 weight % of the lithium content. Since $^7Li$ does not undergo a nuclear reaction by thermal neutrons its presence within an HTS body would constitute a useless substitute. Accordingly, a compound which is enriched in the $^6Li$ isotope is preferred for use in order to minimize the amount of $^7Li$ which is introduced into the HTS body. Compounds of lithium which are enriched in the $^6Li$ isotope permit a greater loading of the reactable $^6Li$ to be achieved which not only reduces the level at which unreactable $^7Li$ contaminant is introduced into the HTS body but also permits the body to be effectively irradiated in a shorter period of time which provides for less residual radioactivity. For example, with regards to a composition prepared with a Li dopant of natural abundance (7.56 wt. % $^6Li$) of the formula $$Y_{0.93}Ba_{1.92}Li_{0.15}Cu_3O_7,$$

a composition of equivalent $^6Li$ content may be prepared with a lithium reagent enriched to 25 wt. % $^6Li$ which is of the formula $$Y_{0.9777}Ba_{1.9777}Li_{0.0466}Cu_3)_7;$$

or with a 50 wt. % $^6Li$ enriched reagent, to a formula of $$Y_{0.9879}Ba_{1.9879}Li_{0.0242}Cu_3O_7;$$

or with a 100 wt. % $^6Li$ reagent, to a formula of $$Y_{0.994}Ba_{1.993}Li_{0.013}Cu_3O_7;$$

each of the above formulas yield an equal number of reached $^6Li$ atoms for exposure to the same thermal neutron fluence.

The minimum quantity of $^6Li$ which may be effectively utilized is in part a function of the maximum thermal neutron fluence to which the HTS body will be permitted to be exposed. For purposes of minimizing exposure of the HTS body to the thermal neutron flux and in order to not overly extend the cost of irridation treatment, it is preferred that $^6Li$ be incorporated into the HTS body in an amount which provides for an atomic ratio of $^6Li$ to copper which is about $1\times10^{-7}$ or greater. These same considerations apply wherein a boron compound is used as a dopant. The $^{10}B$ isotope which is reactive to thermal neutrons occurs in a natural abundance of about 19.8 weight % with the non-reactive $^{11}B$ isotope comprising the balance of about 80.2 weight %.

However the doped HTS precursor composition may be prepared, and however or into what particular body article form that precursor composition may be shaped, it is such preshaped precursor composition body article which is uniformly doped with Li or B and then reacted to form the HTS compound which is the starting body article to which the operation of this process applies.

Such Li or B doped precursor composition is preferably first pre-sintered at a temperature of from about 900–960° C. until its basic unit cell composition comprises $L_1M_2Cu_3O_{6+\delta}$ or $T_2M'_2Ca_nCu_{n+1}O_{6+2n}$, as the case may be. The crystalline symmetry of a 123 HTS precursor compound may basically be tetragonal i.e., A=B=C and hence nonsuperconducting. Preferably, following the sintering treatment a 123 HTX compound body is slowly cooled in the presence of oxygen to insure a $\delta$=about 0.7 to about 1.0, for an oxygen content of from about $L_2M_2Cu_3O_{6.7}$ to about $L_1M_2Cu_3O_7$ to insure such compound is superconducting at a Tc$\geq$77° K.

The overall processing can be viewed as comprising the overall steps of: (1) synthesis of a $^6Li$ or $^{10}B$ doped HTS powder precursor, (2) sintering of the HTS precursor into a $^6Li$ or $^{10}B$ doped HTS compound of a predetermined body form, (3) preferably, melt-textured growth of the compound into a body of highly aligned grains of HTS compound doped with Li or B, (4) oxygenation of a 123 HTS compound to that of an orthorhombic crystalline symmetry and (5) irradiating the body with thermal neutrons.

To minimize the content of radioactive reaction products which may be imparted to the body by the neutrons it is preferred to use a doping level of $^6Li$ or $^{10}B$ which permits the optimum $J_c$ level to be obtained at relatively low fluence levels. Accordingly, whatever may be the Li or B source, that is whether the source is natural abundance Li or B, or whether the source is a $^6Li$ or $^{10}B$ enriched compound, it is preferred to incorporate $^6Li$ to a level which provides a ratio of $^6Li$:Cu of at least about 0.0001, and more preferably of at least about 0.001. Since $^{10}B$ has a larger thermal neutron cross-section than $^6Li$, when $^{10}B$ is used as the dopant, it may be incorporated in lesser quantities than $^6Li$ while permitting the same density of induced defects pinning centers to be activated. Accordingly, when $^{10}B$ is used as the dopant it is preferred to incorporate it in amounts which provide for a ratio of $^{10}B$:Cu of at least about $2.5\times10^{-5}$ more preferably of at least about 0.001.

When $^6Li$ or $^{10}B$ is incorporated with the HTS compound body in the quantities as above described, the quantity of radioactive isotopes produced by the neutron flux is reduced since the level of irradiation exposure (i.e., fluence) needed to optimize the $J_c$ of the body is reduced.

The only radioactive isotope of long life concern produced by the thermal neutrons is $Ba^{133}$ which results from the nuclear reaction of $Ba^{132}$ (barn 8.5) which occurs in a natural abundance of 0.19 wt. %. $Ba^{133}$ has a half-life of 7.2 years. A sample of externally doped $YBa_2Cu_3O_7$ or of internally doped $(YBa)_{3-x}D_xCu_3O_7$ should be allowed to decay for about 30 days after irradiation after which any $^{90}Y$ content ($T_{1/2}$=2.7 days) has decayed to a safe level. The sample will also be at a safe level of $Ba^{133}$ since it is present in minor amounts only due to the low abundance of $Ba^{132}$ and low reaction cross-section.

The degree to which the body article is irradiated depends in part upon its content of the reactive dopant, either $^6Li$ or $^{10}B$. With a $Y_{0.93}Ba_{1.92}Li_{0.15}Cu_3O_7$ (naturally abundant Li) HTS body composition the resulting $J_c$ of the body has been observed to increase progressively with irradiation at least up to that point wherein about $2\times10^{-9}$ atoms of $^6Li$ have undergone reaction relative to each copper atom present in the material. Accordingly, a doped body should be exposed to a thermal neutron fluence sufficient to provide a ratio of reacted $^6$Li atom ($^6$Li*) to copper atom of $^6$Li*:cu of from at least about $5\times10^{-8}$, and more preferably at least from about $5\times10^{-7}$. Wherein the HTS composition is one of bismuth or thallium the sample should be exposed to a neutron fluence sufficient to react at least about $2\times10^{-9}$ dopant atoms per copper atom, and perefrably at least about $1\times10^{-6}$ dopant atoms per copper atom.

For some applications it may be desired to have a body composed of an HTS material wherein some areas within the body have a higher $J_c$ than other areas. Such applications may be those wherein a field profile control for trapping magnetic fields is needed for the design of a levitation bearing and like devices. The process of this invention is well suited to the formation of a HTS body article which is internally or externally patterned to possess regions of higher $J_c$ adjacent to regions of lower $J_c$. This may be readily accomplished by imparting to the HTS body a patterned doping with the $^6$Li or $^{10}$B dopant following which the so-patterned body is irradiated with thermal neutrons as previously described.

EXAMPLE 1

Figure 1:
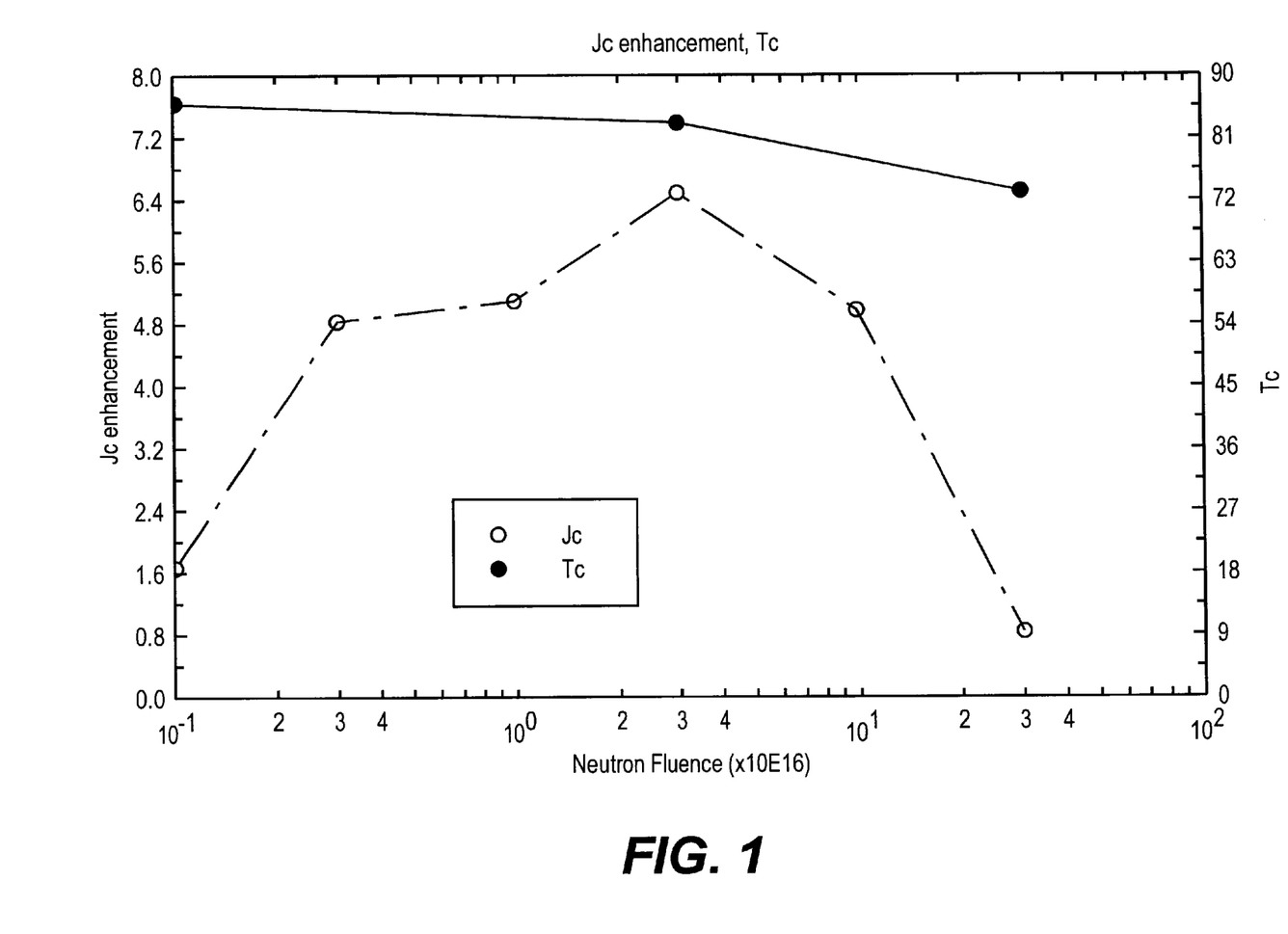
FIG. 1 is a graph which illustrates the effect upon the $J_c$ and $T_c$ properties, of a body article composed of $Bi_2Sr_{1.8}Ca_1Cu_{1.2}Li_{0.8}O_8$ then irradiated to different fluence levels with thermal neutrons.
Figure 2:
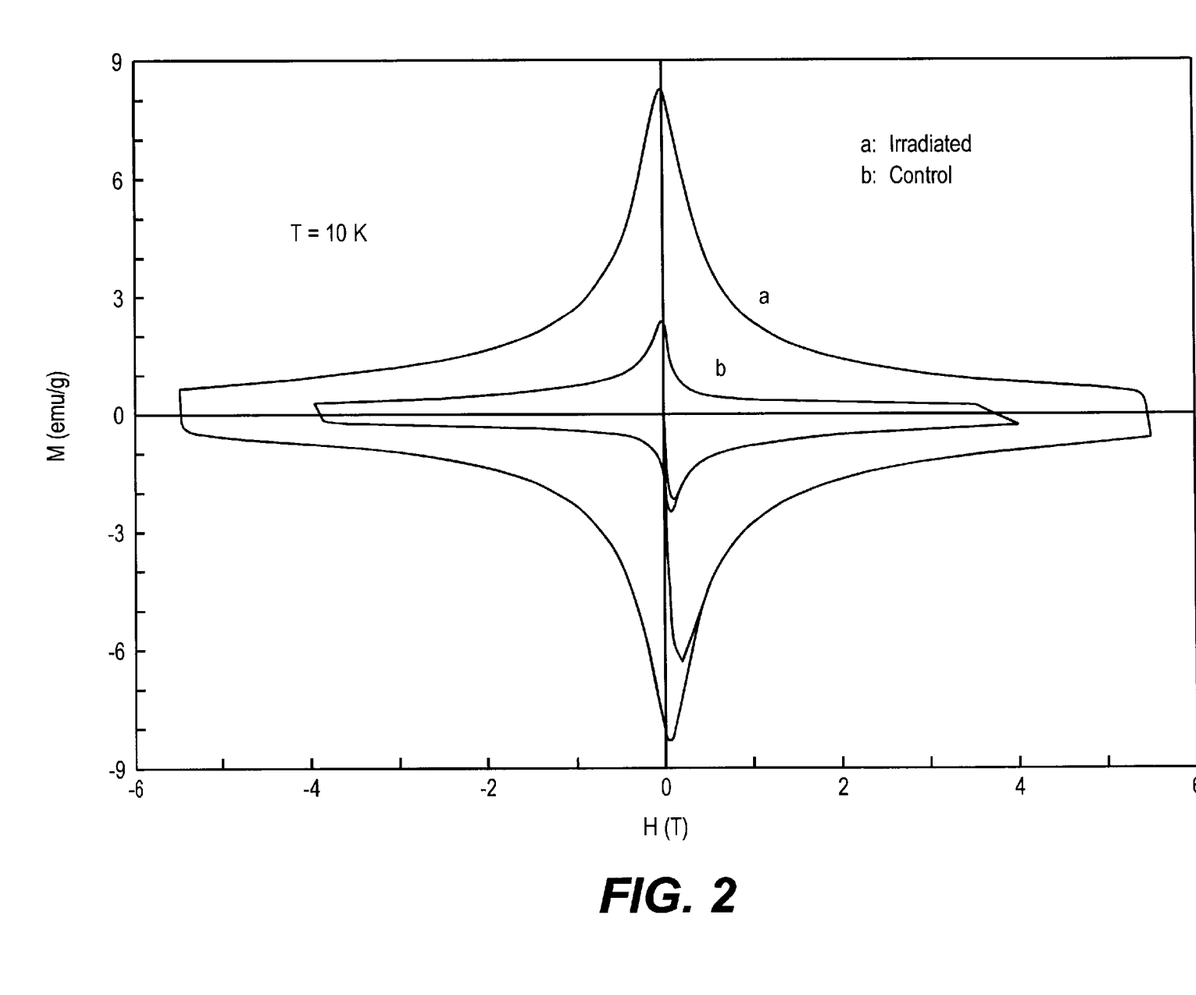
FIG. 2 shows the magnetization hysteresis loop of a body article composed of $Bi_2Sr_{1.8}Ca_1Cu_{1.2}Li_{0.8}O_8$, in one case the body was not irradiated and in the other the body was irradiated with thermal neutrons (η) to a fluence of $10^{17}$η/cm$^2$.

The effects of thermal neutron induced reaction products on the superconducting properties of melt-texture Bi—Sr—Ca—Cu—O doped with different isotopes with large thermal neutron induced nuclear reaction cross sections and large Q-values is illustrated below. Samples of $Bi_2Sr_{1.8}Ca_1Cu_{1.2}Li_{0.8}O_8$ (naturally abundant Li) had been preformed to disc shape by melt texturing were sealed in fused quartz tubes under about 0.8 atm. of oxygen to avoid oxygen losses during irradiation. The neutron irradiation was performed in pile of the reactor at Texas A&M University. The thermal neutron flux was $1.8\times10^{13}/\text{cm}^2$.sec and the fast neutron flux was less than one percent. The pile temperature during the irradiation was about 65° C. The samples were irradiated to thermal neutron fluences from $3\times10^{16}/\text{cm}^2$ to $3\times10^{18}/\text{cm}^2$ at reactor temperature. The influence of the irradiation on the critical current density $J_c$, upper critical magnetic field, transition temperature $T_c$, and transition width was thereafter determined. The critical transition temperature was measured by four-point probe and magnetization measurements were performed at a SQUID system to study the effect of this kind of thermal neutron irradiation on flux pinning and the critical magnetization current. The measurements, illustrated by FIGS. 1 and 2, show the $T_c$ does not change significantly, but $J_c$ increased by a factor of 6.2. This enhancement of $J_c$ relative to unirradiated samples demonstrates that artificially created defects are induced in the sample which act as strong flux pinning centers.

EXAMPLE 2

The effects of thermal neutron induced reaction products on the superconducting properties of sintered $Y_{0.93}Ba_{1.92}Li_{0.15}Cu_3O_7$ (naturally abundant Li) was examined. The Li doped YBCO composition was prepared by intimately admixing in appropriate quantities of $Y_2O_3$, $BaCO_3$, CuO and $Li_2CO_3$. The $Li_2CO_3$ reagent was one with natural abundant lithium. The powder mixture was preformed to disc shape and sintered. Disc samples were sealed in fused quartz tubes under about 0.8 atmospheres of oxygen. These discs were then irradiated in the pile of a reactor for various periods of time to expose each to a different cumulative level of thermal neutron fluence. The influence of the irradiation on the critical current density $J_c$, upper critical magnetic field, transition temperature $T_c$, and transition width was thereafter determined. The critical transition temperature was measured by four-point probe and magnetization measurements were performed at a VSM system to study the effect of this kind of thermal neutron irradiation on flux pinning and the critical magnetization current.

Figure 3:
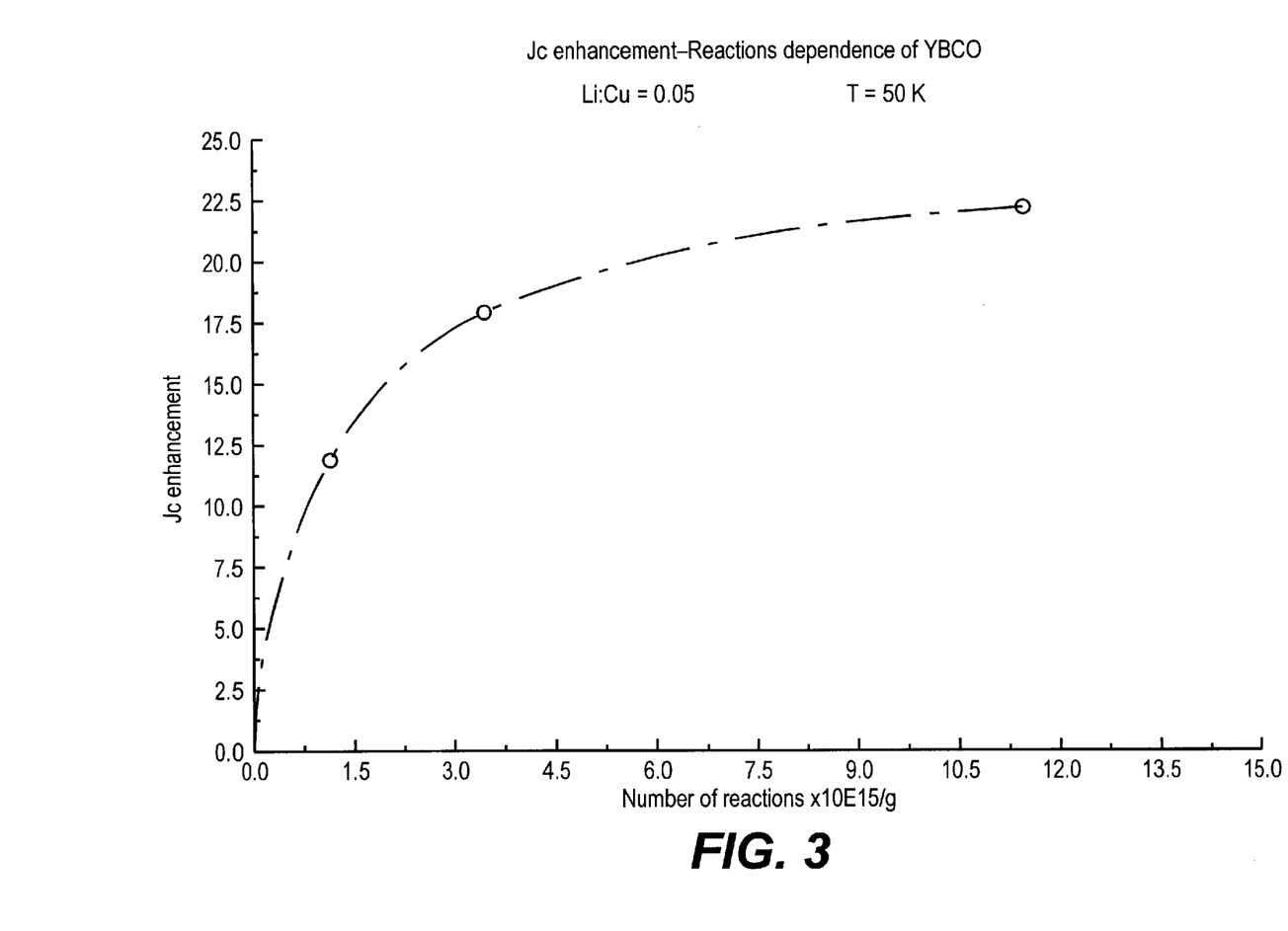
FIG. 3 is a graph which illustrates the effect upon the critical current density ($J_c$) of a body article composed of $Y_{0.93}Ba_{1.92}Li_{0.15}Cu_3O_7$, then irradiated to different fluence levels with thermal neutrons.
Figure 4:
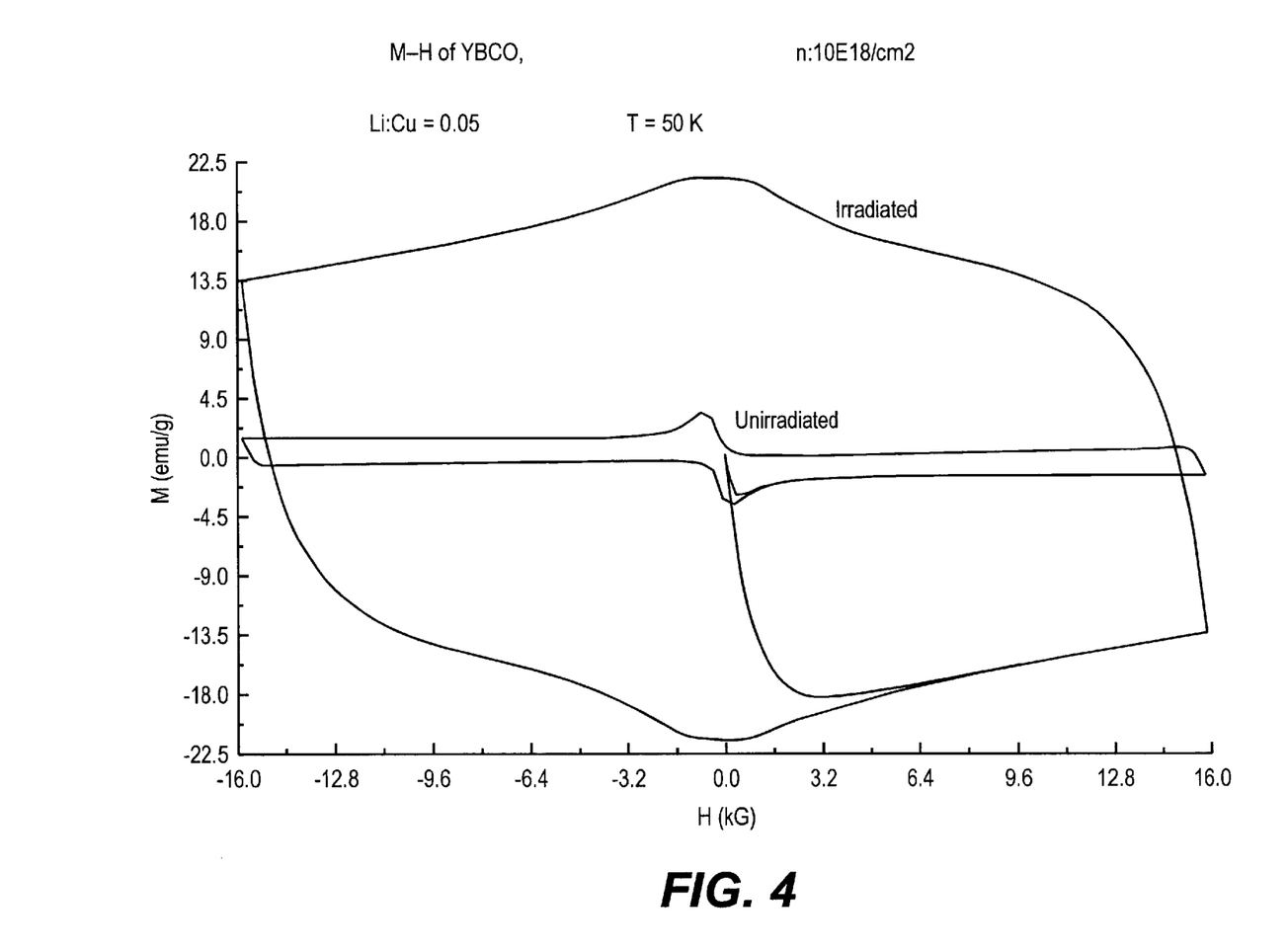
FIG. 4 shows the magnetization hysteresis loop of a body article composed of $Y_{0.93}Ba_{1.92}Li_{0.15}Cu_3O_7$, wherein in one case the body was not irradiated and in the second case the body was irradiated with thermal neutrons to a fluence level of $10^{18}\eta/cm^2$.

Magnetic measurements on disc samples subjected to different levels of neutron fluence, as shown in FIG. 3, show an enhancement in the $J_c$ of each relative to preirradiation $J_c$ of the YBCO material. Radiation to a fluence level of about $0.75\times10^{17}/\text{cm}^2$ enhanced the $J_c$ by a factor of about 12. Continued exposure to higher fluence levels continued to enhance the resulting $J_c$ of the sample to at least a fluence level of $10^{18}/\text{cm}^2$ without any observable adverse effect upon the $T_c$ properties of the sample. FIG. 4 shows the magnetization hystereisis loop of a YBCO sample having a Li doping level of 5 atomic % relative to atomic copper after irradiation to a neutron fluence level of $10^{18}/\text{cm}^2$ in comparison to an unirradiated sample of similar composition.

The invention has been described with reference to its preferred embodiments. One skilled in the art may appreciate from this description changes or variations which may be made which do not depart from the scope or spirit of the invention described above and claimed hereafter.

What is claimed is:

1. A process for enhancing the critical current density of a bulk body article composed having Li intimately distributed in a composition of a high temperature superconducting composition, comprising the steps of:

positioning a bulk body article in a position to be irradiated comprised of a composition of the formula $L_1M_2Cu_3O_{6+d}$, $T_2M'_2Ca_nCu_{n+1}O_{6+2n}$, $(L+M)_{3-z}D_zCu_3O_{6+d}$, or $T_2M'_2Ca_n(Cu_{1-z'}D_{z'})_{n+1}O_{6+2n}$, wherein L is yttrium, lanthanum, neodymium, samarium, europium, gadolinium, dysprosium, holmium, erbium, thulium, ytterbium, or lutetium, or mixtures thereof including mixtures with scandium, cerium, praseodymium, terbium, M is barium, strontium or mixtures thereof; "z" is greater than zero and equal to or less than 0.3; "d" is from about 0.7 to about 1.0; T is bismuth and M' is strontium or T is thallium and M' is barium; and "n" is a number from about 1 to about 3, "z'" is greater than zero and less than or equal to 0.5; and D is Li; wherein the Li is present in an amount to provide for a $^6$Li:Cu ratio of at least about $2.5\times10^{-8}$; radiating the bulk body article with thermal neutrons until a quantity of the Li content of such body portion undergoes thermal neutron induced reaction to produce $^4$He.

2. The process of claim 1 wherein the body article is comprised of $L_1M_2(Cu_3O_{6+d}$ in which Li is intimately distributed and further wherein Li is present in an amount to provide for a $^6$Li:Cu ratio of at least about $1\times10^{-5}$.

3. The process of claim 2 wherein $^6$Li is intimately distributed within such body article composition in an atomic ratio relative to copper equal to or less than 0.5.

4. The process of claim 2 wherein the body article is exposed to a thermal neutron fluence sufficient to react at least one lithium atom per each $10^9$ copper atoms.

5. The process of claim 4 wherein said body article is composed of $Y_1Ba_2Cu_3O_{6+d}$ and contains $^6$Li in an atomic ratio relative to copper of at least about $1\times10^{-3}$.

6. The process of claim 1 wherein said body article is composed of $$(L+M)_{3-z}D_zCu_3O_{6+d}$$

wherein
L is yttrium, lanthanum, samarium, europium, and gadolinium;
M is barium or a mixture of barium and strontium;
D is Li;
"d" is about 0.7 to 1.0;
"z" is from about $1\times10^{-7}$ to about $2\times10^{-2}$;
and the ratio L:M is from about 0.45 to about 0.55.

7. The process of claim 6, wherein portions of such body are exposed to a thermal neutron fluence sufficient to react at least one D atom per each $10^7$ copper atoms.

8. The process of claim 7, wherein L is Y and M is Ba.

9. The process of claim 1, wherein
L is yttrium, lanthanum, samarium, europium or gadolinium;
M is barium;
"d" is about 0.7 to 1.0;
"z" is from about $3\times10^{-5}$ to about $1.5\times10^{-1}$;
and the ratio L:M is about 0.5.

10. The process of claim 9, wherein portions of such body are exposed to a thermal neutron fluence sufficient to react at least one D atom per each $10^7$ copper atoms.

11. The process of claim 10, wherein L is Y and M is Ba.

12. The process of claim 1, wherein
L is yttrium, lanthanum, samarium, europium and gadolinium;
M is barium or a mixture of barium and strontium;
D is L $^6$Li;
"d" is about 0.7 to 1.0;
"z" is from about $3\times10^{-8}$ to about 0.3;
and the ratio L:M is from about 0.45 to about 0.55 provided that L does not exceed one and M does not exceed two.

13. The process of claim 12, wherein portions of such body are exposed to a thermal neutron fluence sufficient to react at least one D atom per each $10^9$ copper atoms.

14. The process of claim 13, wherein L is Y and M is Ba.

15. The process of claim 14, wherein portions of such body are exposed to a thermal neutron fluence sufficient to react at least one D atom per each $10^7$ copper atoms.

16. The process of claim 1 wherein the body article is comprised of $Bi_2Sr_2Ca_nCu_{n+1}O_{6+2n}$ in which Li is intimately distributed.

17. The process of claim 16 wherein $^6$Li is intimately distributed within such body article composition in an atomic ratio relative to copper equal to or less than 0.5.

18. The process of claim 1, wherein said body article is composed of $$T_2M'_2Ca_n(Cu_{1-z'}D_{z'})_{n+1}O_{6+2n}$$

wherein
T is bismuth and M' is strontium, or
T is thallium and M' is barium;
"n" is a number from about 1 to about 2;
"z'" is greater than zero and less than or equal to 0.5.

19. The process of claim 18, wherein portions of such body are exposed to a thermal neutron fluence sufficient to react at least one D atom per each $10^9$ copper atoms.

20. The process of claim 19, wherein T is bismuth and M' is strontium and "z'" is from about $2.5\times10^{-8}$ to about $5\times10^{-1}$.

21. The process of claim 20, wherein portions of such body are exposed to a thermal neutron fluence sufficient to react at least one D atom per each $10^9$ copper atoms.

22. The process of claim 21, wherein "z'" is from about $1\times10^{-6}$ to about $1\times10^{-1}$.

23. The process of claim 22, wherein portions of such body are exposed to a thermal neutron fluence sufficient to react one Li atom per each $10^7$ copper atoms.

* * * * *